(12) United States Patent
Hsu et al.

(10) Patent No.: US 11,177,321 B2
(45) Date of Patent: Nov. 16, 2021

(54) RESISTIVE RANDOM ACCESS MEMORIES AND METHOD FOR FABRICATING THE SAME

(71) Applicant: Winbond Electronics Corp., Taichung (TW)

(72) Inventors: Po-Yen Hsu, New Taipei (TW); Bo-Lun Wu, Tianzhong Township, Changhua County (TW); Shih-Ning Tsai, Taichung (TW); Cheng-Hui Tu, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/661,121

(22) Filed: Oct. 23, 2019

(65) Prior Publication Data
US 2021/0126053 A1 Apr. 29, 2021

(51) Int. Cl.
*H01L 27/24* (2006.01)
*G11C 13/00* (2006.01)
*H01L 45/00* (2006.01)

(52) U.S. Cl.
CPC ........ *H01L 27/249* (2013.01); *G11C 13/0002* (2013.01); *H01L 45/1253* (2013.01); *H01L 45/146* (2013.01); *H01L 45/1608* (2013.01)

(58) Field of Classification Search
CPC combination set(s) only.
See application file for complete search history.

(56) References Cited

U.S. PATENT DOCUMENTS

| 2010/0237312 A1* | 9/2010 | Seol .................... H01L 27/2445 257/2 |
| 2012/0248504 A1* | 10/2012 | Liu ..................... H01L 45/1226 257/208 |
| 2015/0123067 A1* | 5/2015 | Lee ..................... H01L 27/2481 257/4 |
| 2015/0179705 A1* | 6/2015 | Wouters ................ H01L 27/249 257/5 |

FOREIGN PATENT DOCUMENTS

KR 101355623 B1 1/2014

* cited by examiner

*Primary Examiner* — Michelle Mandala
*Assistant Examiner* — Jordan M Klein
(74) *Attorney, Agent, or Firm* — Muncy, Geissler, Olds & Lowe, P.C.

(57) ABSTRACT

A resistive random access memory is provided. The resistive random access memory includes a substrate, a first electrode formed on the substrate, a second electrode formed on the substrate and located on one side of the first electrode, a first metal oxide layer formed on sidewalls of the second electrode, a first control layer formed between the first electrode and the first metal oxide layer, and a second control layer formed on the first control layer and located between the first electrode and the first metal oxide layer.

14 Claims, 7 Drawing Sheets

RESISTIVE RANDOM ACCESS MEMORIES AND METHOD FOR FABRICATING THE SAME

TECHNICAL FIELD

The technical field relates to a resistive random access memory with multi-level switching.

BACKGROUND

Resistive random access memories (RRAM) have the advantages of fast operation speed and low power consumption. It is ideal for the next generation of non-volatile memory. In a resistive random access memory, a transition metal oxide (TMO) layer is disposed between two metal electrodes. The status of conductive filaments in the transition metal oxide layer is controlled to electrically switch between a high-resistance state (HRS) and a low-resistance state (LRS). In addition, since the distribution patterns of the conductive filaments directly affect the resistance, one of the development goals of the resistive random access memory is to stably the multi-level switching by controlling the write voltage.

A memory cell of a conventional resistive random access memory is formed by sequentially stacking a lower electrode, a metal oxide layer and an upper electrode. Since the conductive path of the conductive filaments in the metal oxide layer is controlled to generate different high resistance or low resistance states, it is impossible to regulate the state of the multi-level switching. While the resistive random access memory is operated, it is difficult to control the growth of the conductive filaments. One of the reasons is that the metal oxide layer is susceptible to environmental and other processes and is unstable during manufacture.

SUMMARY

In accordance with one embodiment of the invention, a resistive random access memory is provided. The resistive random access memory includes a substrate, a first electrode formed on the substrate, a second electrode formed on the substrate and located on one side of the first electrode, a first metal oxide layer formed on sidewalls of the second electrode, a first control layer formed between the first electrode and the first metal oxide layer, and a second control layer formed on the first control layer and located between the first electrode and the first metal oxide layer.

In accordance with one embodiment of the invention, a method for fabricating a resistive random access memory is provided, including the following steps, for example, a substrate is provided, a first control layer is formed on the substrate, a second control layer is formed on the first control layer, a first trench is formed through the first control layer and the second control layer, a metal layer is filled in the first trench to form a first electrode, a second trench is formed on one side of the first trench and through the first control layer and the second control layer, and a metal layer is filled in the second trench to form a second electrode. The second electrode is surrounded by a first metal oxide layer. The first control layer and the second control layer are located between the first electrode and the first metal oxide layer. The material of the first control layer is different from that of the second control layer.

In the structure of the resistive random access memory of the present invention, a stacked control layer including at least two layers of different materials is disposed on sidewalls of a single metal oxide layer and in contact therewith. By the characteristics of each layer in the stacked control layer having different abilities to absorb oxygen atoms for the metal oxide layer, in the process of modulating the applied voltage, the conductive filaments in the metal oxide layer are formed into various distribution patterns, and different resistance configurations are thus obtained to store a larger amount of data. The present invention can achieve multi-level switching effect easily and quickly. In addition, due to the special structural design of the present invention, two adjacent resistive random access memory cells can share a single electrode connected to an external circuit, thereby effectively reducing the number of external vias and the process variability between cells. Furthermore, since the metal oxide layer is disposed on the substrate in a vertical manner, and the stacked control layer is designed, the password information stored in the memory cell is not easily destroyed or readout, and has a high degree of security.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
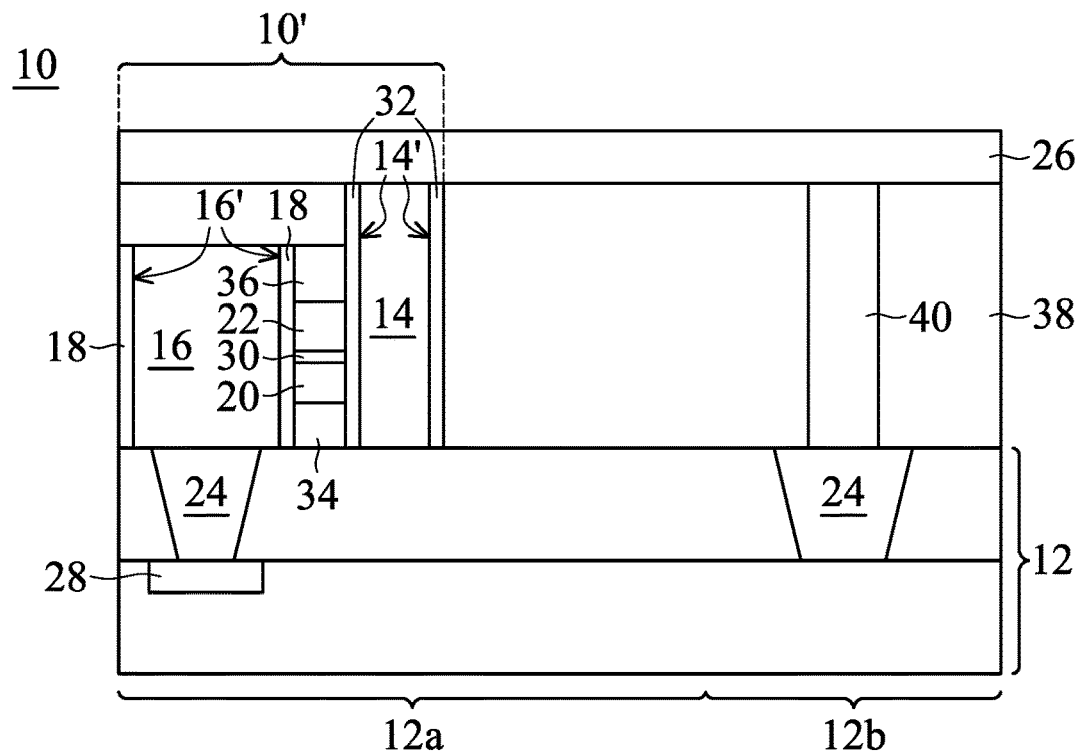
FIG. 1 is a cross-sectional view in accordance with one embodiment of the invention.

Referring to FIG. 1, a resistive random access memory (RRAM) 10 includes a substrate 12, a first electrode 14, a second electrode 16, a metal oxide layer 18, a first control layer (e.g., oxygen reservoir layer) 20 and a second control layer 22. The substrate 12 includes an array region 12a and a peripheral region 12b. Vias are formed in the substrate 12, distributed in the array region 12a and the peripheral region 12b, and filled with a conductive material 24. An oxide layer 38 is formed on the substrate 12. A bit line 26 is formed on the oxide layer 38. The first electrode 14 is located in the oxide layer 38 and electrically connected to the bit line 26. The second electrode 16 is located in the oxide layer 38 and on one side of the first electrode 14. The second electrode 16 is electrically connected to the conductive material 24 and further electrically connected to a word line 28 by the conductive material 24. The metal oxide layer 18 is formed on sidewalls 16' of the second electrode 16. That is, the metal oxide layer 18 is disposed on the substrate 12 along the sidewalls 16' of the second electrode 16. The first control layer 20 is formed between the first electrode 14 and the metal oxide layer 18 and substantially in contact with the metal oxide layer 18. The second control layer 22 is formed on the first control layer 20 and located between the first electrode 14 and the metal oxide layer 18. The second control layer 22 is substantially in contact with the metal oxide layer 18. That is, the metal oxide layer 18 is simultaneously connected to the first control layer 20 and the second control layer 22. In some embodiments, the first electrode 14 and the second electrode 16 may include titanium (Ti) or titanium nitride (TiN). In some embodiments, the metal oxide layer 18 may include any suitable transition metal oxide (TMO), for example, hafnium oxide (HfO). In some embodiments, the first control layer 20 and a second control layer 22 are, for example, oxygen reservoir layers, including any suitable material having the ability to absorb oxygen atoms, for example, titanium (Ti), tantalum (Ta), hafnium (Hf), aluminum (Al) or tungsten (W). In addition, in another embodiment, while an additional oxidation process (e.g., oxygen implantation) is performed on the oxygen control layer, additional oxygen can be supplied to the control layer. Specifically, it is required for the first control layer 20 and the second control layer 22 to select different materials, that is, one of the stacked control layers has a higher ability to absorb oxygen atoms, and the other has a lower ability to absorb oxygen atoms. This is to make various layers of the stacked control layers have different abilities to absorb oxygen atoms for the metal oxide layer 18. In this embodiment, two control layers are stacked between the first electrode 14 and the metal oxide layer 18. In some embodiments, three or more control layers may be stacked between the first electrode 14 and the metal oxide layer 18 as needed, and are in substantial contact with the metal oxide layer 18.

The resistive random access memory 10 further includes a first barrier layer 30 formed between the first control layer 20 and the second control layer 22 to avoid undesired mutual flow of oxygen atoms, absorbed from the metal oxide layer 18, between the first control layer 20 and the second control layer 22, affecting the stability of the multi-level switching. The resistive random access memory 10 further includes a second barrier layer 32 formed on sidewalls 14' of the first electrode 14 and located between the first electrode 14 and the first control layer 20 and the second control layer 22 to prevent oxygen atoms in the first control layer 20 and the second control layer 22 from flowing into the first electrode 14, it is also helpful to maintain the stability of the electrical switching. The resistive random access memory 10 further includes a third barrier layer 34 formed between the first control layer 20 and the substrate 12 and located between the second barrier layer 32 and the metal oxide layer 18 to prevent oxygen atoms in the first control layer 20 from flowing downward into the substrate 12. The resistive random access memory 10 further includes a fourth barrier layer 36 formed on the second control layer 22 and located between the second barrier layer 32 and the metal oxide layer 18 to prevent oxygen atoms in the second control layer 22 from flowing upward into the oxide layer 38. Specifically, the arrangement of the first barrier layer 30, the second barrier layer 32, the third barrier layer 34 and the fourth barrier layer 36 ensures that oxygen atoms absorbed from the metal oxide layer 18 in the first control layer 20 and the second control layer 22 are temporarily retained in their own layers, and do not flow outward to the other layers, which is beneficial to the stability of operation. In some embodiments, the first barrier layer 30, the second barrier layer 32, the third barrier layer 34 and the fourth barrier layer 36 may include silicon oxide, silicon nitride or any suitable high dielectric constant material. In addition, the first barrier layer 30, the second barrier layer 32, the third barrier layer 34 and the fourth barrier layer 36 are formed by, for example, high density plasma chemical vapor deposition (HDP-CVD).

As shown in FIG. 1, the first electrode 14, the second electrode 16, the metal oxide layer 18, the first control layer 20, the second control layer 22 and other related components (such as barrier layers) located in the array region 12a of the substrate 12 constitute a resistive random access memory cell 10'. A peripheral wire 40 is further formed in the peripheral region 12b of the substrate 12. An external circuit signal is transmitted to the bit line 26 via the peripheral wire 40, and then transmitted to the resistive random access memory cell 10' via the bit line 26.

Figure 2:
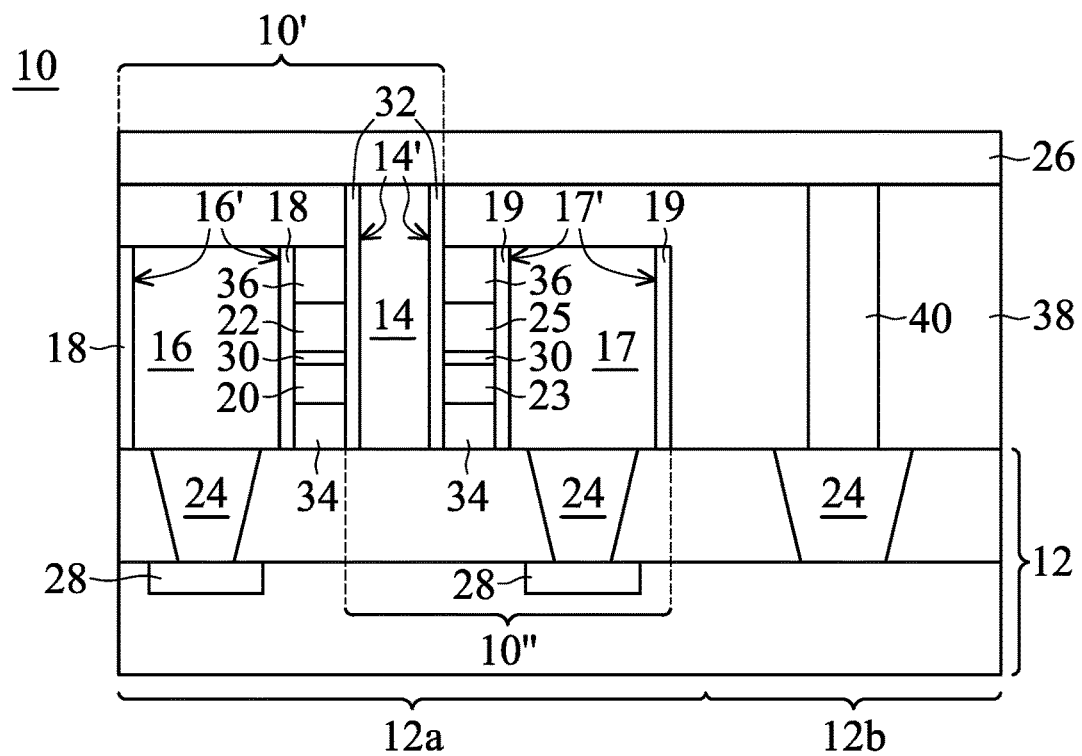
FIG. 2 is a cross-sectional view in accordance with one embodiment of the invention.

Referring to FIG. 2, the difference between this embodiment and the embodiment of FIG. 1 is that their structures are different. The following only illustrates the differences, and will not repeat the same parts. In this embodiment, a third electrode 17, a metal oxide layer 19, a third control layer 23 and a fourth control layer 25 are further formed on the other side (e.g., the opposite side of the second electrode 16) of the first electrode 14. The third electrode 17 is formed in the oxide layer 38 and located above the substrate 12. The third electrode 17 is electrically connected to the conductive material 24 in the substrate 12, and further electrically connected to the word line 28 by the conductive material 24. The metal oxide layer 19 is formed on sidewalls 17' of the third electrode 17. That is, the metal oxide layer 19 is disposed on the substrate 12 along the sidewalls 17' of the third electrode 17. The third control layer 23 is formed between the first electrode 14 and the metal oxide layer 19 and substantially in contact with the metal oxide layer 19. The fourth control layer 25 is formed on the third control layer 23 and located between the first electrode 14 and the metal oxide layer 19. The fourth control layer 25 is substantially in contact with the metal oxide layer 19. That is, the metal oxide layer 19 is simultaneously connected to the third control layer 23 and the fourth control layer 25. Specifically, it is required for the third control layer 23 and the fourth control layer 25 to select different materials. In this embodiment, two control layers are stacked between the first electrode 14 and the metal oxide layer 18. Also, two control layers are stacked between the first electrode 14 and the metal oxide layer 19. In some embodiments, three or more control layers may be stacked between the first electrode 14 and the metal oxide layer 18 as needed, and are in substantial contact with the metal oxide layer 18, or three or more control layers may be stacked between the first electrode 14 and the metal oxide layer 19, and are in substantial contact with the metal oxide layer 19.

In this embodiment, the first barrier layer 30 is further formed between the third control layer 23 and the fourth control layer 25. The second barrier layer 32 formed on the sidewalls 14' of the first electrode 14 is also located between the first electrode 14 and the third control layer 23 and the fourth control layer 25. The third barrier layer 34 is further formed between the third control layer 23 and the substrate 12 and located between the second barrier layer 32 and the metal oxide layer 19. The fourth barrier layer 36 is further formed on the fourth control layer 25 and located between the second barrier layer 32 and the metal oxide layer 19. Specifically, the arrangement of the first barrier layer 30, the second barrier layer 32, the third barrier layer 34 and the fourth barrier layer 36 also ensures that oxygen atoms absorbed from the metal oxide layer 19 in the third control layer 23 and the fourth control layer 25 are temporarily retained in their own layers, and do not flow outward to the other layers As shown in FIG. 2, the first electrode 14, the second electrode 16, the first metal oxide layer 18, the first control layer 20, the second control layer 22 and other related components (such as barrier layers) located in the array region 12a of the substrate 12 constitute a first resistive random access memory cell 10'. The first electrode 14, the third electrode 17, the second metal oxide layer 19, the third control layer 23, the fourth control layer 25 and other related components (such as barrier layers) located in the array region 12a of the substrate 12 constitute a second resistive random access memory cell 10". As can be seen from the structure of this figure, the first resistive random access memory cell 10' shares the first electrode 14 with the second resistive random access memory cell 10". That is, the single bit line 26 connected to the first electrode 14 can be electrically connected to a plurality of resistive random access memory cell s at the same time. A peripheral wire 40 is further formed in the peripheral region 12b of the substrate 12. An external circuit signal is transmitted to the bit line 26 via the peripheral wire 40, and then respectively transmitted to the first resistive random access memory cell 10' and the second resistive random access memory cell 10" via the bit line 26.

Figure 3A:
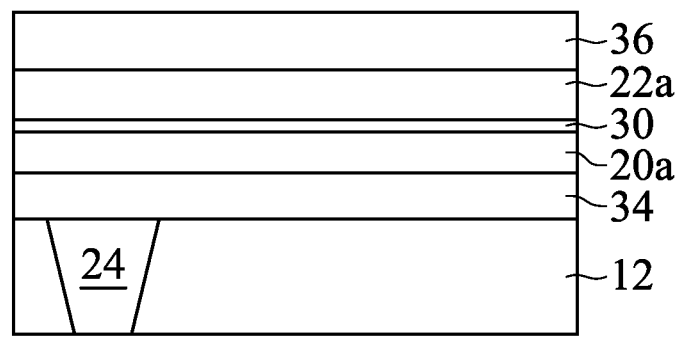
FIGS. 3A-3D shows a fabrication method in accordance with one embodiment of the invention.

Referring to FIG. 3A, in accordance with one embodiment of the invention, a cross-sectional view of a method for fabricating a resistive random access memory is shown. First, a substrate 12 is provided. Vias are formed in the substrate 12 and filled with conductive material 24. Next, a barrier layer 34, a control layer 20a, a barrier layer 30, a control layer 22a and a barrier layer 36 are sequentially formed on the substrate 12.

Figure 3B:
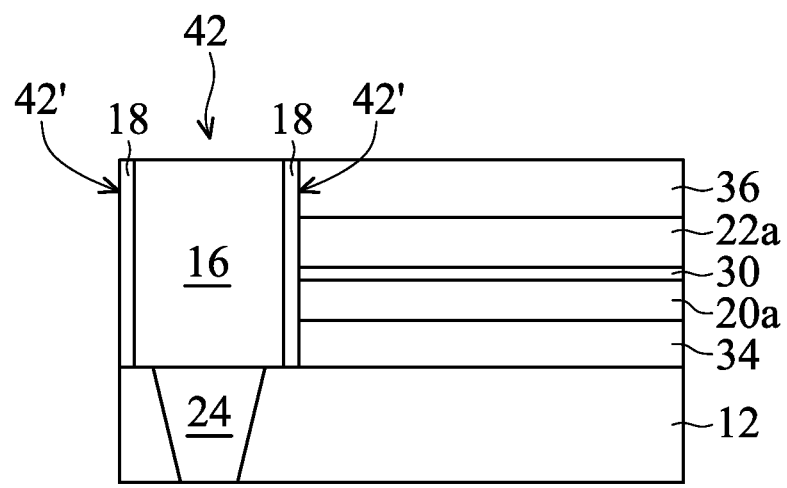

Referring to FIG. 3B, the barrier layer 36, the control layer 22a, the barrier layer 30, the control layer 20a and the barrier layer 34 are then etched until the conductive material 24 is exposed, and a trench 42 is formed. Next, a metal oxide layer 18 is formed on sidewalls 42' of the trench 42, and a metal layer 16 is filled in the trench 42 to form an electrode 16. The electrode 16 is surrounded by the metal oxide layer 18.

Figure 3C:
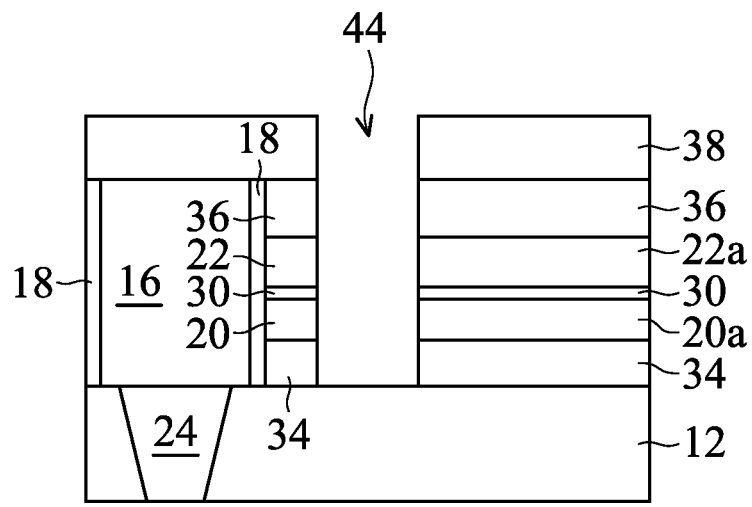

Referring to FIG. 3C, an oxide layer 38 is then formed on the electrode 16 and the barrier layer 36. The oxide layer 38, the barrier layer 36, the control layer 22a, the barrier layer 30, the control layer 20a and the barrier layer 34 are then etched until the substrate 12 is exposed, and a trench 44 is formed on one side of the electrode 16. The portions of the control layers 20a and 22a located between the trench 44 and the metal oxide layer 18 are defined as a first control layer 20 and a second control layer 22.

Figure 3D:
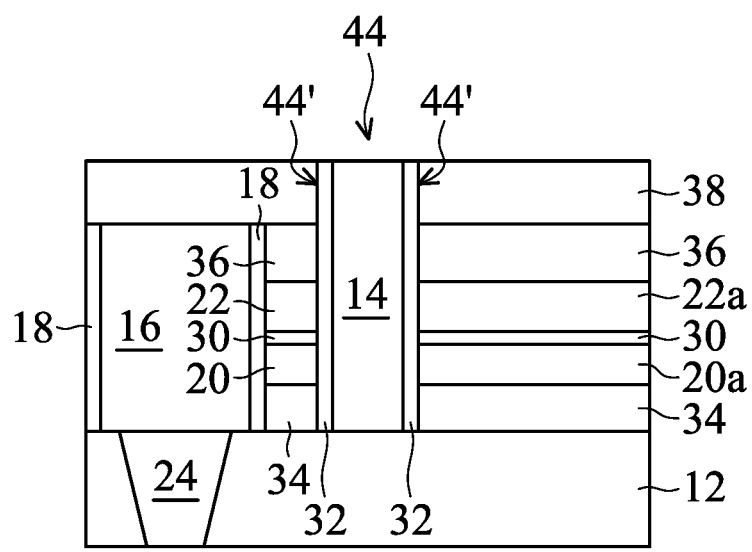

Referring to FIG. 3D, a barrier layer 32 is formed on sidewalls 44' of the trench 44, and a metal layer 14 is filled in the trench 44 to form an electrode 14. The electrode 14 is surrounded by the barrier layer 32 located between the electrode 14 and the first control layer 20 and the second control layer 22. The first control layer 20 and the second control layer 22 are located between the electrode 14 and the metal oxide layer 18 and in substantial contact with the metal oxide layer 18. So far, the fabrication of the resistive random access memory 10 as shown in FIG. 1 is completed.

Referring to FIGS. 4A-4D, in accordance with one embodiment of the invention, a cross-sectional view of a method for fabricating a resistive random access memory is shown. This embodiment is similar to the embodiment of FIGS. 3A-3D. The following only illustrates the differences, and will not repeat the same parts.

Figure 4A:
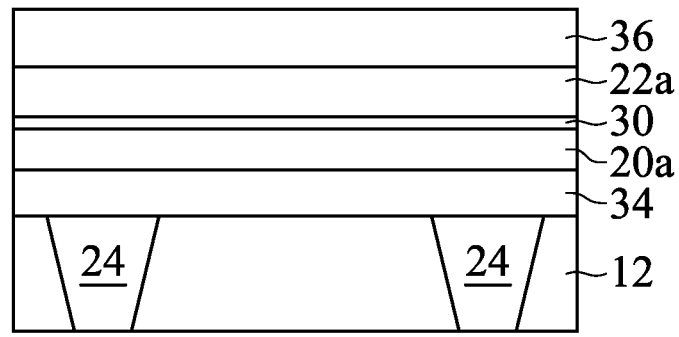
FIGS. 4A-4D shows a fabrication method in accordance with one embodiment of the invention.
Figure 4B:
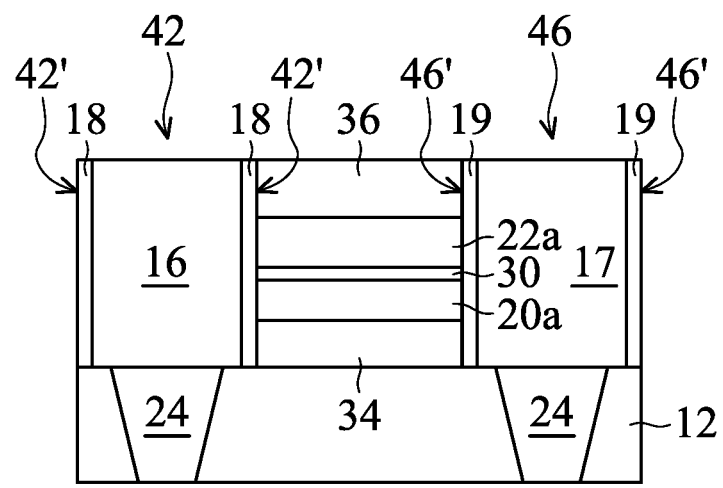

Referring to FIG. 4B, an etching process is performed on two adjacent locations in the substrate 12 to expose the conductive material 24, respectively. Next, a metal oxide layer 18 and a metal oxide layer 19 are respectively formed on sidewalls 42' and 46' of trenches 42 and 46, and electrodes 16 and 17 are formed in the trenches 42 and 46.

Figure 4C:
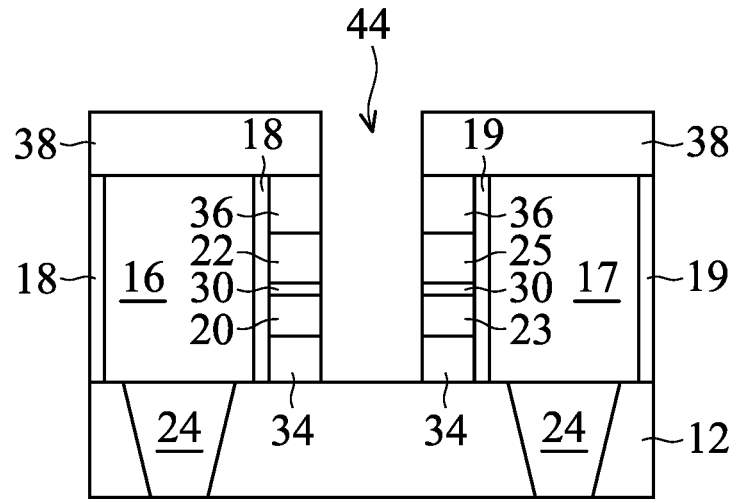

Referring to FIG. 4C, a trench 44 is then formed. Specifically, the trench 44 separates the control layers 20a and 22a into a stacked layer of a first control layer 20 and a second control layer 22 and a stacked layer of a third control layer 23 and a fourth control layer 25.

Figure 4D:
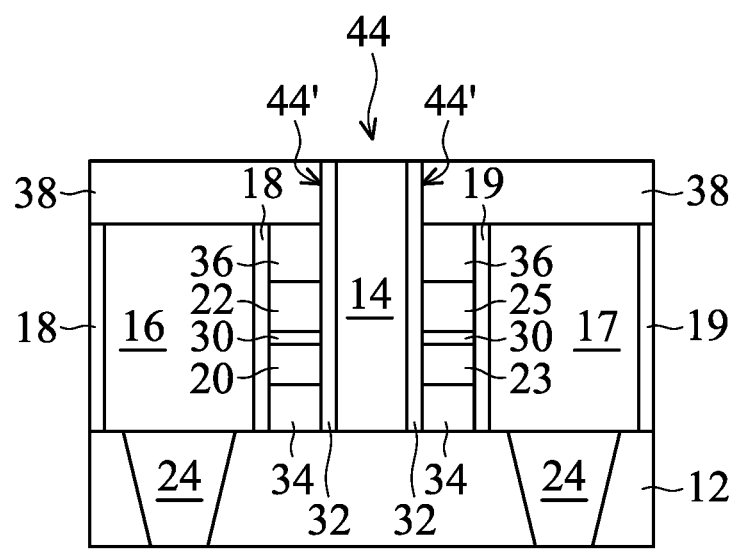

Referring to FIG. 4D, a barrier layer 32 and an electrode 14 are then formed. The barrier layer 32 is located between the electrode 14 and the first control layer 20 and the second control layer 22. The first control layer 20 and the second control layer 22 are located between the electrode 14 and the metal oxide layer 18 and in substantial contact with the metal oxide layer 18. The barrier layer 32 is also located between the electrode 14 and the third control layer 23 and the fourth control layer 25. The third control layer 23 and the fourth control layer 25 are located between the electrode 14 and the metal oxide layer 19 and in substantial contact with the metal oxide layer 19. So far, the fabrication of the resistive random access memory 10 as shown in FIG. 2 is completed.

Figure 5A:
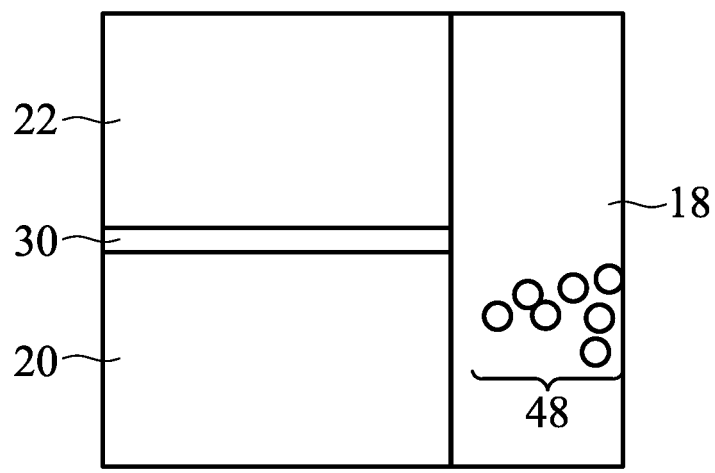
FIGS. 5A-5D shows a relationship between variation of conductive filaments and resistance in a metal oxide layer of a resistive random access memory in accordance with one embodiment of the invention.
Figure 5B:
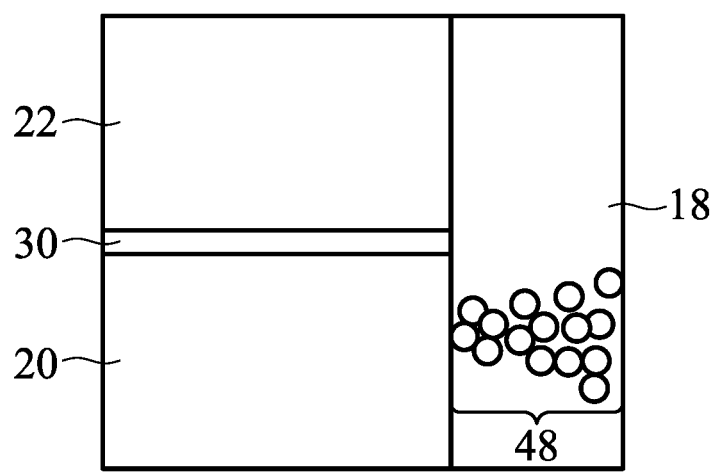
Figure 5C:
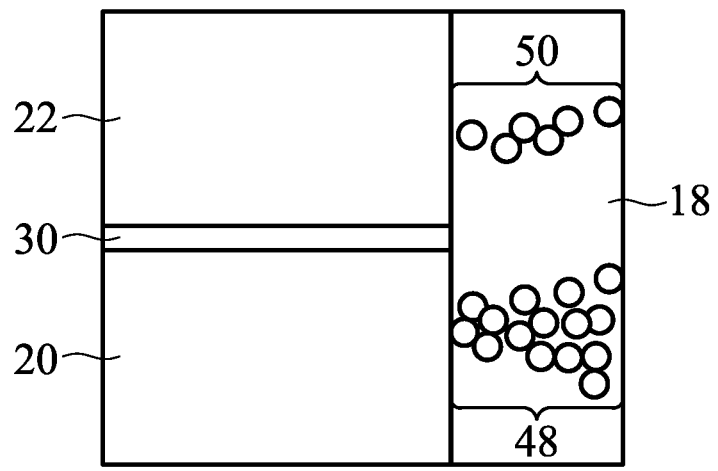
Figure 5D:
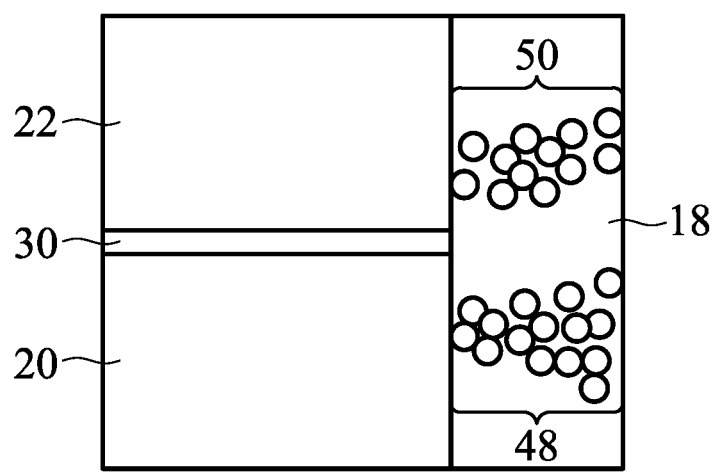

Referring to FIGS. 5A-5D, in accordance with one embodiment of the invention, a relationship between variation of conductive filaments and resistance in a metal oxide layer of a resistive random access memory is shown. In the figures, the parts, for example, the metal oxide layer 18, the first control layer 20, the second control layer 22 and the first barrier layer 30 in the resistive random access memory 10 are merely shown. The first control layer 20 has a relatively high ability to absorb oxygen atoms. The second control layer 22 has a relatively low ability to absorb oxygen atoms. The first barrier layer 30 is disposed between the first control layer 20 and the second control layer 22. Referring to FIG. 5A, at this stage, since the conductive filaments 48 formed in the metal oxide layer 18 relative to the position of the first control layer 20 has not yet formed a conductive path, and no conductive filament has been formed in the metal oxide layer 18 relative to the position of the second control layer 22, the component is turned off. Referring to FIG. 5B, when a first voltage is applied, due to the higher ability of the first control layer 20 to absorb oxygen atoms, the conductive filaments 48 in the metal oxide layer 18 relative to the position of the first control layer 20 form a dense conductive path. However, since the second control layer 22 has a low ability to absorb oxygen atoms, in the case where the first voltage is insufficient to cause the second control layer 22 to absorb oxygen atoms in the metal oxide layer 18, no conductive filament has been formed in the metal oxide layer 18 relative to the position of the second control layer 22. At this stage, the component is in a first turn-on stage (with a first resistance value). Referring to FIG. 5C, when a second voltage which is greater than the first voltage is applied, the conductive filaments 48 in the metal oxide layer 18 relative to the position of the first control layer 20 continue to maintain the dense conductive path. At this time, the second voltage is sufficient to cause the second control layer 22 to start absorbing oxygen atoms in the metal oxide layer 18, so that the conductive filaments 50 in the metal oxide layer 18 relative to the position of the second control layer 22 form a conductive path, but the conductive path is loose. At this stage, the component is in a second turn-on stage (with a second resistance value). Referring to FIG. 5D, when a third voltage which is greater than the second voltage is applied, except that the conductive filaments 48 in the metal oxide layer 18 relative to the position of the first control layer 20 continue to maintain the dense conductive path, at this time, the conductive filaments 50 in the metal oxide layer 18 relative to the position of the second control layer 22 also form a dense conductive path. At this stage, the component is in a third turn-on stage (with a third resistance value). Specifically, the first resistance value of the first turn-on stage is greater than the second resistance value of the second turn-on stage, and the second resistance value of the second turn-on stage is greater than the third resistance value of the third turn-on stage. It can be seen from the various distribution patterns of the conductive filaments in the metal oxide layer with the applied voltage in the figures, in the process of increasing the applied voltage, the resistive random access memory of this embodiment can exhibit three resistance configurations (for example, high resistance, medium resistance, low resistance). That is, the resistive random access memory of this embodiment can increase the storage capacity by about three times compared with the conventional resistive random access memory.

In the structure of the resistive random access memory of the present invention, a stacked control layer including at least two layers of different materials is disposed on sidewalls of a single metal oxide layer and in contact therewith. By the characteristics of each layer in the stacked control layer having different abilities to absorb oxygen atoms for the metal oxide layer (for example, one layer has a relatively high ability to absorb oxygen atoms, and the other layer has a relatively low ability to absorb oxygen atoms), in the process of modulating the applied voltage, the conductive filaments in the metal oxide layer are formed into various distribution patterns, and different resistance configurations are thus obtained to store a larger amount of data. The present invention can achieve multi-level switching effect easily and quickly. In addition, due to the special structural design of the present invention, two adjacent resistive random access memory cells can share a single electrode connected to an external circuit, thereby effectively reducing the number of external vias and the process variability between cells. Since the metal oxide layer is disposed on the substrate in a vertical manner, and the stacked control layer is designed, the password information stored in the memory cell is not easily destroyed or readout, and has a high degree of security. Since the metal oxide layer is fabricated after the barrier layer and the control layer are stacked, the metal oxide layer of the present invention cannot be damaged by subsequent processes as compared with the prior art, therefore, the present invention can fabricate a relatively stable metal oxide layer.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A resistive random access memory, comprising:
a substrate;
a first electrode formed on the substrate;
a second electrode formed on the substrate and located on one side of the first electrode;
a first metal oxide layer formed on sidewalls of the second electrode;
a first control layer formed between the first electrode and the first metal oxide layer and in direct contact with the first metal oxide layer; and
a second control layer formed on the first control layer and located between the first electrode and the first metal oxide layer and in direct contact with the first metal oxide layer.

2. The resistive random access memory as claimed in claim 1, wherein the first electrode is electrically connected to a bit line, and the second electrode is electrically connected to a word line.

3. The resistive random access memory as claimed in claim 1, wherein the first control layer and the second control layer comprise titanium (Ti), tantalum (Ta), hafnium (Hf), aluminum (Al) or tungsten (W), and the first control layer has a material different from that of the second control layer.

4. The resistive random access memory as claimed in claim 1, further comprising a first barrier layer formed between the first control layer and the second control layer.

5. The resistive random access memory as claimed in claim 1, further comprising a second barrier layer formed on sidewalls of the first electrode and located between the first electrode and the first control layer and the second control layer.

6. The resistive random access memory as claimed in claim 1, wherein the first electrode, the second electrode, the first metal oxide layer, the first control layer and the second control layer constitute a single resistive random access memory cell.

7. The resistive random access memory as claimed in claim 1, further comprising a third electrode, a second metal oxide layer and a third control layer, wherein the third electrode is formed on the substrate and located on another side of the first electrode, the second metal oxide layer is formed on sidewalls of the third electrode, and the third control layer is formed between the first electrode and the second metal oxide layer.

8. The resistive random access memory as claimed in claim 7, further comprising a fourth control layer formed on the third control layer and located between the first electrode and the second metal oxide layer, wherein the third control layer has a material different from that of the fourth control layer.

9. A method for fabricating a resistive random access memory, comprising:
providing a substrate;
forming a first control layer on the substrate;
forming a second control layer on the first control layer;
forming a first trench through the first control layer and the second control layer;
filling a metal layer in the first trench to form a first electrode;
forming a second trench on one side of the first trench and through the first control layer and the second control layer; and
filling a metal layer in the second trench to form a second electrode surrounded by a first metal oxide layer, wherein the first control layer and the second control layer are located between the first electrode and the first metal oxide layer and in direct contact with the first metal oxide layer, and the first control layer has a material different from that of the second control layer.

10. The method for fabricating a resistive random access memory as claimed in claim 9, further comprising forming a first barrier layer between the first control layer and the second control layer.

11. The method for fabricating a resistive random access memory as claimed in claim 9, further comprising forming a second barrier layer on sidewalls of the first electrode and located between the first electrode and the first control layer and the second control layer.

12. The method for fabricating a resistive random access memory as claimed in claim 11, further comprising forming a third barrier layer and a fourth barrier layer, wherein the third barrier layer is located between the first control layer and the substrate and between the second barrier layer and the first metal oxide layer, and the fourth barrier layer is located on the second control layer and between the second barrier layer and the first metal oxide layer.

13. The method for fabricating a resistive random access memory as claimed in claim 9, further comprising forming a third trench on another side of the first trench and through the first control layer and the second control layer, and filling a metal layer in the third trench to form a third electrode surrounded by a second metal oxide layer, wherein the first control layer and the second control layer are located between the first electrode and the second metal oxide layer.

14. The method for fabricating a resistive random access memory as claimed in claim 9, wherein, in the step of forming the second electrode, after the first metal oxide layer is formed on sidewalls of the second trench, the metal layer is filled in the second trench.

\* \* \* \* \*